(12) United States Patent
Katsuda et al.

(10) Patent No.: US 6,486,085 B1
(45) Date of Patent: Nov. 26, 2002

(54) ALUMINUM NITRIDE SINTERED BODIES AND SEMICONDUCTOR-PRODUCING MEMBERS INCLUDING SAME

(75) Inventors: Yuji Katsuda, Tsushima (JP); Masaaki Masuda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 50 days.

(21) Appl. No.: 09/659,529

(22) Filed: Sep. 12, 2000

(30) Foreign Application Priority Data

Sep. 30, 1999 (JP) .......................... 11-278727
Aug. 1, 2000 (JP) .......................... 2000-232598

(51) Int. Cl.⁷ ........................ C04B 35/581; C04B 35/582
(52) U.S. Cl. ...................... 501/98.4; 279/128; 428/472; 428/698; 428/699
(58) Field of Search ................ 501/98.4, 152; 279/128; 428/472, 698, 699

(56) References Cited

U.S. PATENT DOCUMENTS

| | | | |
|---|---|---|---|
| 3,930,875 A | * | 1/1976 | Ochiai et al. ............. 501/98.4 |
| 5,036,026 A | * | 7/1991 | Yamanaka et al. ......... 501/98.4 |
| 5,147,832 A | * | 9/1992 | Shimoda et al. ........... 501/98.4 |
| 5,306,679 A | * | 4/1994 | Shimoda et al. ........... 501/98.04 |
| 5,958,813 A | | 9/1999 | Aida et al. |
| 5,993,699 A | | 11/1999 | Katsuda et al. |
| 5,998,321 A | | 12/1999 | Katsuda et al. |
| 6,001,760 A | | 12/1999 | Katsuda et al. |
| 6,051,303 A | * | 4/2000 | Katsuda et al. |
| 6,174,583 B1 | * | 1/2001 | Yamada et al. |
| 6,239,402 B1 | * | 5/2001 | Araki et al. |

FOREIGN PATENT DOCUMENTS

| | | | |
|---|---|---|---|
| EP | 0 798 278 A2 | | 10/1997 |
| GB | 2127390 A | | 4/1984 |
| JP | 49-001454 A | * | 1/1974 |
| JP | 9-315867 | * | 12/1997 |
| JP | 11-100271 | * | 4/1999 |

OTHER PUBLICATIONS

Patent Abstracts of Japan, vol. 1999, No. 09, Jul. 30, 1999 & JP 11 100271 A (Kyocera Corp.), Apr. 13, 1999 *abstract*.

* cited by examiner

*Primary Examiner*—David Sample
(74) *Attorney, Agent, or Firm*—Burr & Brown

(57) ABSTRACT

An aluminum nitride sintered body is provided. The aluminum nitride has a polycrystalline structure of aluminum nitride crystals having an average particle diameter in a range of 5 μm to 20 μm and cerium in a range of 0.01 wt % 1.0 wt %, when calculated as an oxide thereof. The aluminum nitride sintered body has a room temperature volume resistivity in a range of $1\times10^8$ Ω·cm to $1\times10^{12}$ Ω·cm under the application of 500 V/mm, and a value of α in the I-V relational equation, $I=kV^\alpha$, is in a range of 1.0 to 1.5, V being a voltage in a range of 100 V/mm to 1000 V/mm, I being a leak current when V is applied to said aluminum nitride body, k being a constant, and α being a non-linear coefficient.

12 Claims, 1 Drawing Sheet

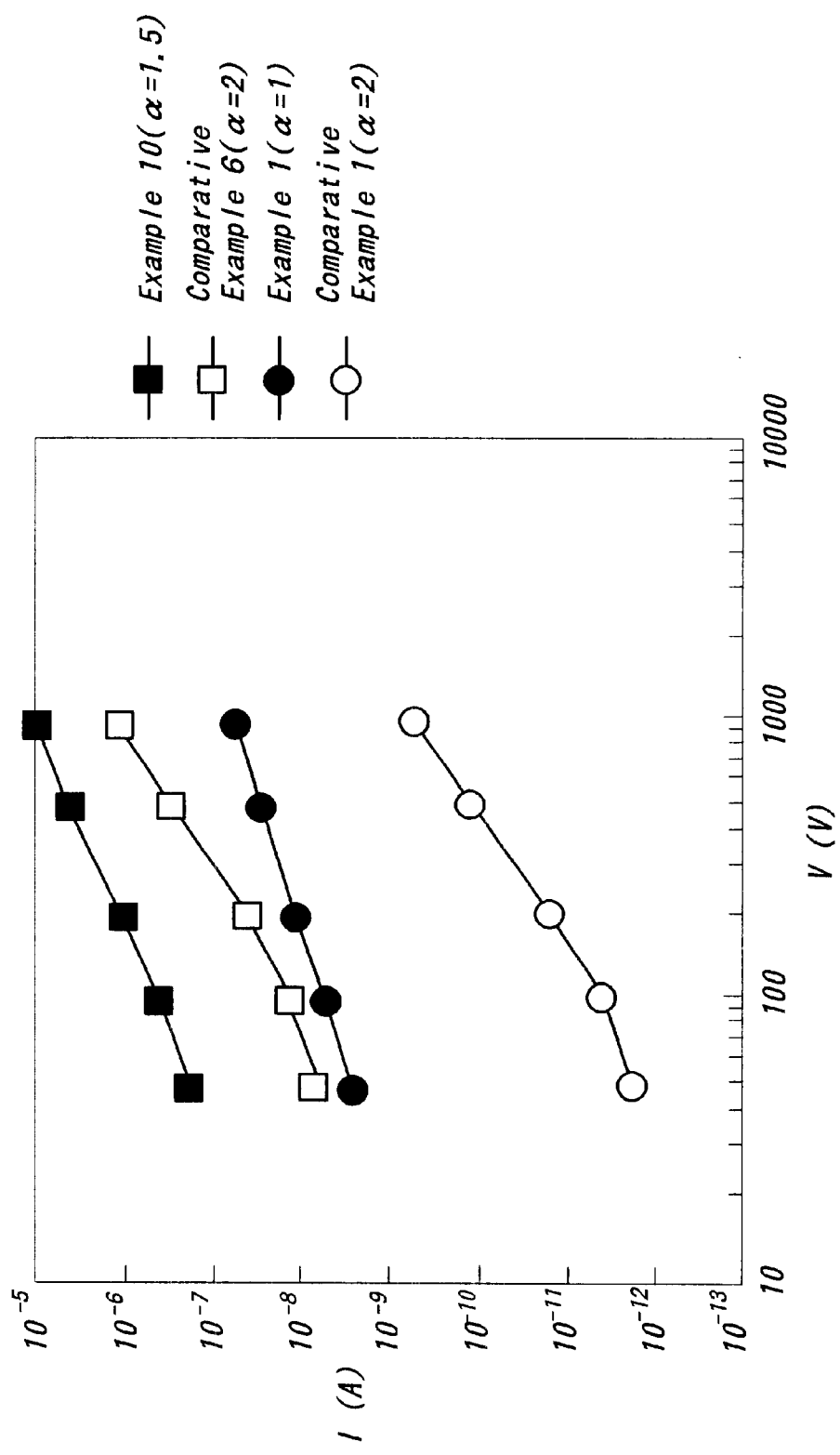

the content of cerium is preferably not more than 0.7 wt % when calculated as an oxide thereof.

ALUMINUM NITRIDE SINTERED BODIES AND SEMICONDUCTOR-PRODUCING MEMBERS INCLUDING SAME

FIELD OF THE INVENTION

The present invention relates to aluminum nitride sintered bodies and semiconductor-producing members using the same.

BACKGROUND OF THE INVENTION

As a method for attracting and holding a semiconductor wafer, an electrostatic chucking system utilizing the Johnsen-Rahbek force is useful. When the volume resistivity of a substrate of the electrostatic chuck is set at $10^8$ $\Omega \cdot cm$ to $10^{12} \Omega \cdot cm$, high attracting force and high response can be obtained. Therefore, what is important in developing the electrostatic chucks is to control the volume resistivity of the substrate to $10^8$ $\Omega \cdot cm$ to $10^{12}$ $\Omega \cdot cm$ in a use temperature range.

For instance, NGK disclosed in JP-A 9-315,867 (U.S. Pat. No. 6,001,760) that the volume resistivity can be controlled to $10^8$ $\Omega \cdot cm$ to $10^{12}$ $\Omega \cdot cm$ at room temperature by adding a very small amount of yttrium oxide to aluminum nitride having a high purity.

In the aluminum nitride sintered body disclosed in JP-A 9-315,867, the resistance can be reduced. However, it is revealed that when the voltage applied varies, the leak current largely changes, which exhibits a behavior like a so-called varistor. That is, it is clarified that the value of $\alpha$ in a I-V relational equation: $I=kV^{\alpha}$ (V to the $\alpha$th power, k: a constant and $\alpha$: a non-linear coefficient) is a high value of 1.5 to 2.0 in case of V being in a range of not less than 100 V/mm and not more than 1000 V/mm, I being a leak current when a voltage V is applied to the aluminum nitride sintered body. Such a non-ohmic voltage-current behavior is not preferable for parts for the semiconductor-producing apparatus, particularly for the semiconductor susceptor containing the electrostatic electrode. For example, although a dielectric layer is present between the electrostatic chucking electrode and the surface of the chuck, the thickness of the dielectric layer slightly varies or deviates. Since the voltage is constant between the electrostatic chucking electrode and the surface of the electrostatic chuck, the voltage applied (V/mm) is smaller in a thicker portion of the dielectric layer and larger in a thinner portion thereof. When the leak current varies in a non-ohmic manner with respect to the voltage applied, the deviation in within the plane of the leak current increases. Consequently, the attracting force can be unstable.

SUMMARY OF THE INVENTION

It is an object of the present invention to reduce the volume resistivity and suppress the non-ohmic behavior between the voltage applied and the leak current in a sintered body of aluminum nitride having a high purity.

The present invention relates to an aluminum nitride sintered body composed mainly of aluminum nitride, having a polycrystalline structure of aluminum nitride crystals, and containing not less than 0.01 wt % to not more than 1.0 wt % of cerium when calculated as an oxide thereof.

The present inventors discovered that when a small amount of cerium is incorporated into the aluminum nitride sintered body, the volume resistivity of the sintered body can be reduced, and the non-ohmic behavior between the voltage applied and the leak current can be suppressed, and as the case may be, almost the ohmic behavior can be realized. The inventors reached the present invention based on this discovery.

BRIEF DESCRIPTION OF THE DRAWING

For a better understanding of the invention, reference is made to the drawing, wherein FIG. 1 is a graph showing the relationship between the voltage V applied and the leak current I in a sintered body in each sample.

DETAILED DESCRIPTION OF THE INVENTION

The content of aluminum in the sintered body according to the present invention needs to be so high as to make aluminum nitride grains present as a main phase, preferably not less than 35 wt %, and more preferably not less than 50 wt %. Besides the aluminum nitride crystals, a very small amount of other crystal phases may be contained in the polycrystalline structure of the aluminum nitride crystals.

In order to exhibit the effects of the present invention, the content of cerium needs to be not less than 0.01 wt % when calculated as an oxide thereof. From this point of view, the content of cerium is preferably not less than 0.1 wt % when calculated as an oxide thereof. If the content of cerium exceeds 1.0 wt %, the volume resistivity of the aluminum nitride sintered body tends to increase. Therefore, the content of cerium is set at not more than 1.0 wt % from the standpoint of view for reducing the volume resistivity. From this point of view, the content of cerium is preferably not more than 0.7 wt % when calculated as an oxide thereof.

JP-A 11-100,271 discloses aluminum nitride ceramics containing cerium in an amount of 2 to 20 mol % when calculated as its oxide as well as $CeAlO_3$ and having a low volume resistivity. The content of cerium of the aluminum nitride ceramics is converted to about 7.9 wt % to 51 wt %. This means that when a large amount of cerium is incorporated into the aluminum nitride ceramics, a large amount of $CeAlO_3$ (cerium aluminate) is precipitated in grain boundaries of aluminum nitride grains to form a continuous phase of cerium aluminate in the grain boundaries, and electricity is flown through this continuous phase.

The measurement of the aluminum nitride sintered bodies according to the present invention reveals that some of them comprise a single phase of aluminum nitride and other comprise an aluminum nitride phase and a cerium aluminate phase. In general, there is a tendency that as the content of cerium in the sintered body increases, the cerium aluminate comes out.

In particular, measurement of the sintered bodies with a high power XRD sometimes detects either one of or both of the aluminum nitride phase and the cerium aluminate phase and the $CeAl_{11}O_{18}$ phase. Measuring condition for the high power XRD will be described later.

The content of metal impurities excluding cerium is preferably not more than 100 ppm, more preferably not more than 50 ppm. This case can provide highly corrosion-resistant sintered bodies suitable for applications disliking impurities to a high extent, such as semiconductor applications.

According to a preferred embodiment of the present invention, the content of rare earth elements excluding cerium in the aluminum nitride sintered body when calculated as oxides thereof is not less than 0.01 wt % and not more than 0.5 wt %.

The present inventors found out that uneven colors ranging from redish brown to brown appeared on parts of surfaces of the aluminum nitride sintered bodies according to the present invention added with a very small amount of cerium, as the case may be. However, completely no change in various characteristics have been observed corresponding to such uneven colors. The present inventors discovered that when a very small amount of rare earth elements excluding cerium, are added together with cerium in such an amount that not less than 0.01 wt % of the rare earth elements may be incorporated as calculated in the form of oxides thereof, such uneven colors can be prevented or controlled without substantially changing various characteristics of the sintered body. From the standpoint of maintaining color uniformity of the sintered body, the content of rare earth elements, excluding cerium, is more preferably not less than 0.03 wt % when calculated as the oxides thereof.

From the standpoint of providing highly corrosion-resistant sintered bodies suitable for applications without impurities to a high degree, such as for semiconductor applications and from the standpoint of obtaining a low volume resistivity, the content of the rare earth elements is preferably not more than 0.5 wt % when calculated as the oxides thereof. Further, from the standpoint of providing highly corrosion-resistant sintered bodies suitable for applications without impurities to a high degree, such as for semiconductor applications, the content of metal elements, excluding aluminum, and the rare earth elements (including cerium) is preferably not more than 100 ppm, more preferably not more than 50 ppm.

Although not limited to any one, the rare earth elements are preferably yttrium, neodymium, samarium, gadolinium, dysprosium, erbium, and ytterbium, and yttrium is particularly preferred.

In the aluminum nitride sintered body according to the present invention, the content of carbon is preferably not more than 0.05 wt %. Further, the average particle diameter of the aluminum nitride crystals constituting the aluminum nitride sintered body according to the present invention is preferably not less than 5 $\mu$m and not more than 20 $\mu$m. The relative density of the aluminum nitride sintered body is preferably not less than 95%.

In the aluminum nitride sintered body according to the present invention, the non-ohmic behavior between the voltage applied and the leak current is suppressed. More specifically, a value of at in an I-V relational equation: $I=kV^\alpha$ (V to the $\alpha$th power) is not less than 1.0 and not more than 1.5 in case of V being in a range of not less than 100 V/mm and not more than 1000 V/mm, I being a leak current when a voltage V is applied to the aluminum nitride sintered body, k being a constant and a being a non-linear coefficient.

The reason why such conspicuous function and effect appear is not clear, but it is considered that when powdery aluminum nitride having a high purity is sintered, a barrier is high at grain boundaries and the electrical conduction at the grain boundaries is of a tunnel effect, so that the sintered body exhibits a non-ohmic electrical conduction characteristic.

For example, when highly pure aluminum nitride powder, to which a very small amount of yttrium oxide is added, is sintered, oxygen impurity of aluminum nitride powder is solid-solved into the aluminum nitride grains of the sintered body, so that the electrical resistance in the grains decreases. However, it is considered that the barrier is high at the grain boundaries and the electrical conduction at the grain boundaries is of a tunnel effect, so that the sintered body exhibits a non-ohmic electrical conduction characteristic.

To the contrary, when highly pure aluminum nitride powder, to which a very small amount of cerium oxide is added, is sintered, oxygen impurities (existing in the form of alumina) contained in the aluminum nitride raw powder react with cerium oxide, so that a phase of cerium-aluminum oxide occurs to promote the liquid-phase sintering of aluminum nitride.

Due to the promoted liquid-phase sintering, the aluminum nitride grains become coarse. In the final sintered bodies, it is confirmed that cerium-aluminum oxide remains in the grain boundaries as a precipitate. Further, a part of oxygen contained in the raw powder is solid solved into the aluminum nitride grains, so that a donor level is formed with oxygen within the aluminum nitride grain to reduce the electrical resistance in the grain. In this way, it is considered that the aluminum nitride grains become coarse to reduce the number of the grain boundaries having high resistance and to decrease the electrical resistance in the grains, thereby decreasing the volume resistivity for the bulk sintered body.

In addition to this, it is considered that the barrier at the grain boundary is decreased by adding cerium oxide, so that the aluminum nitride grains are brought into ohmic contact with one another. However, much of controlling the resistance in such grain boundaries is unclear.

As the raw material for aluminum nitride, materials obtained by various producing methods such as direct nitriding, reduction nitriding and gas phase synthesis from alkyl aluminium may be used.

To the raw powder for aluminum nitride, compounds (i.e., cerium oxide precursors) such as cerium nitrate, cerium sulfate and cerium oxalate, which produce cerium oxide by heating, can be added. The cerium oxide precursor may be added in the form of powder. Alternatively, a solution may prepared by dissolving a compound such as cerium nitrate or cerium sulfate into a solvent, and this solution added to the raw powder. When the cerium oxide precursor is dissolved into the solvent in this way, cerium can be highly dispersed among the aluminum nitride grains. This is particularly useful when the addition amount of cerium is small.

A preform of aluminum nitride to be sintered can be formed by a known method, such as dry pressing, doctor blade, extruding or casting.

The sintered body according to the present invention is preferably obtained by hot press sintering. The preform to be sintered is preferably hot press sintered under pressure of 50 kgf/cm$^2$ or more.

The sintered bodies according to the present invention can be favorably used as various parts in semiconductor-producing apparatuses such as silicon wafer-treating apparatuses and liquid crystal display-producing apparatuses.

The sintered bodies according to the present invention are particularly suitable as corrosion-resistance parts, such as susceptors, in semiconductor-producing apparatuses. Further, the sintered bodies are suitable for metal-buried products in which metallic parts are buried in the above corrosion-resistance parts. As the corrosion-resistance members, susceptors, rings, dooms, etc. to be arranged inside the semiconductors may be recited, for example. In the susceptor, a heater electrode, an electrostatic chucking electrode, a high frequency voltage generating electrode or the like may be buried.

Further, as mentioned above, the sintered body according to the present invention has a low resistance, high purity and the relationship between the voltage applied and the leak current being near the ohmic behavior, the sintered body is particularly useful for a substrate for the electrostatic chuck. Inside the substrate for the electrostatic chuck, a heater electrode, a plasma-generating electrode or the like may be buried besides the electrostatic chuck electrode.

EXAMPLES

In the following examples, aluminum nitride sintered bodies were actually produced, and their characteristics were evaluated.

Sintered bodies in the Examples and the Comparative Examples in Tables 2 to 6 were prepared by using commercially available reduction nitridation powder and commercially available cerium nitrate. The composition of that powder is shown in Table 1.

TABLE 1

| Aluminum nitride powder | |
|---|---|
| SI | 4 ppm |
| Fe | 3 ppm |
| Ti | less than 1 ppm |
| Ca | 7 ppm |
| Mg | 5 ppm |
| K | less than 0.5 ppm |
| Na | 1 ppm |
| P | less than 1 ppm |
| Cr | 1 ppm |
| Mn | less than 0.1 ppm |
| Ni | less than 1 ppm |
| Cu | less than 1 ppm |
| Zn | less than 0.1 ppm |
| Y | less than 0.5 ppm |
| W | 1 ppm |
| B | less than 1 ppm |
| N | 33.87 wt % |
| O | 0.93 wt % |
| C | 0.03 wt % |

One hundred weight parts of the aluminum nitride powder and cerium nitrate in a weight given in Tables 2–6 (shown by weight part unit, as calculated in the form of oxide) were weighed, added into isopropyl alcohol, and wet mixed for 4 hours by using a nylon pot and media. After mixing, the resulting slurry was taken out, and dried at 110° C. The dried powder was heated at 450° C. in air for 5 hours, thereby obtaining a raw powder for sintering with the nylon contaminant during mixing being burnt out. Cerium nitrate is dissolved in isopropyl alcohol.

The raw powder was uniaxially press molded under pressure of 200 kgf/cm$^2$, thereby obtaining a discoid molded body having a diameter of 100 mm and a thickness of 20 mm. This molded body was placed in a graphite mold, and the molded product was sintered by hot press. The pressing pressure was 200 kgf/mm$^2$, the firing temperature was 1900 or 2000° C., and the sintered body was held at 1900° C. or 2000° C. for 4 hours, and cooled. A vacuum was kept between room temperature and 1000° C., and nitrogen gas was introduced at pressure of 1.5 kgf/cm$^2$ between 1000° C. and 1900° C. or 2000° C.

The following evaluations were made with respect to the thus obtained sintered bodies, and evaluation results are shown in Tables 2 to 6.

(1) Density

Density was measured with pure water as a medium by the Archimedean method.

(2) Content of Metal Impurities

The content of metal impurities was quantitatively determined by an induction coupling plasma spectrum.

(3) Oxygen Content

The oxygen content was quantitatively determined by an inert gas melting infrared absorptiometry.

(4) Carbon Content

The carbon content was quantitatively determined by a high frequency heating infrared absorptiometry.

(5) Content of CeO$_2$

The content of CeO$_2$ was calculated from the quantitative amount of cerium determined by the induction coupling plasma spectrum.

(6) Crystalline Phase

The crystalline phase was identified by XRD. Measuring conditions were that CuKα was used, 35 kV, 20 mA, 2θ=20°–70°.

(7) Crystalline Phase (High power XRD)

The crystalline phase was identified by XRD. Measuring conditions were that CuKα was used, 50 kV, 300 mA, 2θ=20°–70°.

(8) Volume Resistivity at Room Temperature

The volume resistivity was measured in vacuum according to the volume resistivity-measuring method in JIS C2141 for insulating materials. The dimension of the test piece was 50 mm×50 mm×1 mm, and the diameter of a main electrode 20 mm, the inner diameter and the outer diameter of a guard electrode 30 mm and 40 mm, respectively, the diameter of a voltage-applying electrode 45 mm, and silver was used as a material for the electrodes. The voltage applied was varied in a range of 50 V/mm to 1000 V/mm. One minute after the application of the voltage, the intensity of electric current was red, and the volume resistivity was calculated. The columns "Volume resistivity at room temperature" in Tables 2 to 5 give volume resistivity at the applied voltage of 500 V/mm. The indication "9E+11" in Tables means "9×10$^{11}$," and other have similar meanings.

(9) Thermal Conductivity

The thermal conductivity was measured by the laser flush method.

(10) Bending Strength

Bending strength was determined by four-point bending strength test in JIS R 1601 at room temperature.

(11) AlN Grain Diameter

Average AlN grain diameter was determined by measuring diameters of 30 AlN grains using a scanning electron microscope.

(12) α Value

Voltage applied was varied between 50 V and 1000 V, and leak currents were plotted as shown in FIG. 1. In FIG. 1, graphical lines were shown for Examples 1 and 10 and Comparative Examples 1 and 6, respectively. In FIG. 1, the ordinate I gives the leak current as a logarithm. The abscissa V gives the voltage applied as a logarithm. Plots in each of samples were approximated to a straight line according to the method of least squares, and the gradient of this straight line between 100 V and 1000 V was calculated and shown as α in Tables.

(13) Color Uniformity

Following cases were judged as having no good color uniformity.

(a) A sample had different hue classes and/or different brightness classes according to indication signs in "Standard Paint Colors" published by Japan Paint Manufactures Association.

(b) A sample had an identical hue class and an identical brightness class but chroma classes different by two or more levels according to indication signs in "Standard Paint Colors" published by Japan Paint Manufactures Association.

TABLE 2

|  |  | Example 1 | Example 2 | Example 3 | Example 4 | Example 5 |
| --- | --- | --- | --- | --- | --- | --- |
| Formulated composition of materials wt. part | AlN | 100 | 100 | 100 | 100 | 100 |
|  | $CeO_2$ | 0.06 | 0.15 | 0.3 | 0.5 | 0.6 |
| Sintering Temp. (° C.) |  | 1900 | 1900 | 1900 | 1900 | 1900 |
| Density (g/cm$^3$) |  | 3.26 | 3.27 | 3.26 | 3.27 | 3.27 |
| Contents of metal impurities (ppm) |  | less than 30 | less than 30 | less than 30 | less than 30 | less than 50 |
| Oxygen content (wt %) |  | 0.81 | 0.82 | 0.83 | 0.83 | 0.85 |
| Carbon content (wt %) |  | 0.03 | 0.04 | 0.04 | 0.04 | 0.03 |
| $CeO_2$ content (wt %) |  | 0.05 | 0.15 | 0.28 | 0.45 | 0.52 |
| Crystalline phase (XRD) |  | AlN | AlN | AlN CeAlO$_3$ | AlN CeAlO$_3$ | AlN CeAlO$_3$ |
| Crystalline phase (High power XRD) |  | AlN CeAl11O18 | AlN CeAl11O18 | AlN CeAlO$_3$ CeAl11O18 | AlN CeAlO$_3$ CeAl11O18 | AlN CeAlO$_3$ CeAl11O18 |
| Volume resistivity at room temp. (Ω·cm) |  | 9E+11 | 2E+10 | 2E+10 | 7E+10 | 1E+11 |
| Thermal conductivity (W/mK) |  | 98 | 95 | 95 | 100 | 108 |
| Bending Strength (MPa) |  | 370 | 340 | 350 | 310 | 310 |
| AlN grain diameter (μm) |  | 5.4 | 5.9 | 6.1 | 6.3 | 6.5 |
| α |  | 1 | 1 | 1 | 1 | 1 |
| Color uniformity |  | Good | Good | Good | Good | Good |

TABLE 3

|  |  | Example 6 | Comparative Example 1 | Comparative Example 2 | Comparative Example 3 | Example 7 |
| --- | --- | --- | --- | --- | --- | --- |
| Formulated composition of raw materials wt. part | AlN | 100 | 100 | 100 | 100 | 100 |
|  | $CeO_2$ | 0.8 | 0 | 1.5 | 4.6 | 0.03 |
| Sintering Temp. (° C.) |  | 1900 | 1900 | 1900 | 1900 | 2000 |
| Density (g/cm$^3$) |  | 3.28 | 3.26 | 3.28 | 3.35 | 3.27 |
| Contents of metal impurities (ppm) |  | less than 50 | less than 30 | less than 50 | less than 50 | less than 30 |
| Oxygen content (wt %) |  | 0.94 | 0.81 | 1.15 | 1.82 | 0.61 |
| Carbon content (wt %) |  | 0.04 | 0.03 | 0.04 | 0.05 | 0.03 |
| $CeO_2$ content (wt %) |  | 0.74 | less than 0.0001 | 1.41 | 3.93 | 0.01 |
| Crystalline phase (XRD) |  | AlN + CeAlO$_3$ | AlN | AlN CeAlO$_3$ | AlN CeAlO$_3$ | AlN |
| Crystalline phase (High power XRD) |  | AlN CeAlO$_3$ CeAl11O18 | AlN | AlN CeAlO$_3$ | AlN CeAlO$_3$ | AlN + CeAl11O18 |
| Volume resistivity at room temp. (Ω·cm) |  | 5E+11 | 2E+14 | 2E+13 | 1E+15 | 1E+09 |
| Thermal conductivity (W/mK) |  | 110 | 92 | 115 | 120 | 90 |
| Bending Strength (MPa) |  | 330 | 370 | 390 | 420 | 290 |
| AlN grain diameter (μm) |  | 6.6 | 3.5 | 6.4 | 6.5 | 7.2 |
| α |  | 1 | 2 | 1 | 1 | 1.5 |
| Color uniformity |  | No good | No good | No good | Good | Good |

TABLE 4

|  |  | Example 8 | Example 9 | Example 10 | Example 11 | Example 12 |
| --- | --- | --- | --- | --- | --- | --- |
| Formulated composition of raw materials wt. part | AlN | 100 | 100 | 100 | 100 | 100 |
|  | $CeO_2$ | 0.06 | 0.15 | 0.3 | 0.5 | 0.6 |
| Sintering Temp. (° C.) |  | 2000 | 2000 | 2000 | 2000 | 2000 |
| Density (g/cm$^3$) |  | 3.27 | 3.27 | 3.27 | 3.26 | 3.27 |
| Contents of metal impurities (ppm) |  | less than 30 | less than 30 | less than 30 | less than 30 | less than 30 |

TABLE 4-continued

|  | Example 8 | Example 9 | Example 10 | Example 11 | Example 12 |
|---|---|---|---|---|---|
| Oxygen content (wt %) | 0.62 | 0.61 | 0.60 | 0.58 | 0.60 |
| Carbon content (wt %) | 0.03 | 0.04 | 0.04 | 0.04 | 0.04 |
| $CeO_2$ content (wt %) | 0.02 | 0.05 | 0.11 | 0.15 | 0.21 |
| Crystalline phase (XRD) | AlN | AlN | AlN | AlN $CeAlO_3$ | AlN $CeAlO_3$ |
| Crystalline phase (High power XRD) | AlN $CeAl11018$ | AlN $CeAlO_3$ $CeAl11018$ | AlN $CeAlO_3$ $CeAl11018$ | AlN $CeAlO_3$ | AlN $CeAlO_3$ |
| Volume resistivity at room temp. (Ω·cm) | 2E+9 | 3E+9 | 6E+9 | 1E+10 | 7E+9 |
| Thermal conductivity (W/mK) | 90 | 90 | 92 | 96 | 96 |
| Bending Strength (MPa) | 300 | 300 | 310 | 320 | 310 |
| AlN grain diameter (μm) | 7.6 | 7.6 | 7.5 | 7.7 | 7.6 |
| α | 1.5 | 1.5 | 1.5 | 1 | 1 |
| Color uniformity | Good | No good | No good | No good | No good |

TABLE 5

|  |  | Example 13 | Example 14 | Example 15 | Comparative Example 4 | Comparative Example 5 | Comparative Example 6 |
|---|---|---|---|---|---|---|---|
| Formulated composition of raw materials wt. part | AlN | 100 | 100 | 100 | 100 | 100 | 100 |
|  | $CeO_2$ | 0.8 | 1.5 | 4.6 | 0.0 | 7.6 | — |
|  | $Y_2O_3$ | — | — | — | — | — | 0.3 |
| Sintering Temp. (° C.) |  | 2000 | 2000 | 2000 | 2000 | 2000 | 1900 |
| Density (g/cm³) |  | 3.27 | 3.27 | 3.34 | 3.26 | 3.41 | 3.27 |
| Contents of metal impurities (ppm) |  | less than 30 | less than 50 | less than 50 | less than 30 | less than 50 | less than 30 |
| Oxygen content (wt %) |  | 0.59 | 0.65 | 0.82 | 0.79 | 1.03 | 0.84 |
| Carbon content (wt %) |  | 0.04 | 0.04 | 0.04 | 0.03 | 0.05 | 0.03 |
| $CeO_2$ content (wt %) |  | 0.27 | 0.55 | 0.98 | less than 0.0001 | 2.05 | less than 0.0001 |
| Crystalline phase (XRD) |  | AlN + $CeAlO_3$ | AlN + $CeAlO_3$ | AlN + $CeAlO_3$ | AlN | AlN $CeAlO_3$ | AlN |
| Crystalline phase (High power XRD) |  | AlN $CeAlO_3$ | AlN $CeAlO_3$ | AlN $CeAlO_3$ |  |  |  |
| Volume resistivity at room temp. (Ω·cm) |  | 2E+10 | 7E+10 | 2E+11 | 8E+12 | 5E+13 | 8E+10 |
| Thermal conductivity (W/mK) |  | 100 | 108 | 115 | 86 | 148 | 92 |
| Bending Strength (MPa) |  | 320 | 330 | 350 | 340 | 360 | 330 |
| AlN grain diameter (μm) |  | 7.7 | 7.8 | 8.2 | 5.2 | 8.5 | 6.6 |
| α |  | 1 | 1 | 1 | 2 | 1 | 2 |
| Color uniformity |  | No good | No good | No good | No good | Good | Good |

TABLE 6

|  |  | Example 16 | Example 17 | Example 18 | Example 19 |
|---|---|---|---|---|---|
| Formulated composition of raw materials wt. part | AlN | 100 | 100 | 100 | 100 |
|  | $CeO_2$ | 0.08 | 0.15 | 0.15 | 0.08 |
|  | $Y_2O_3$ | 0.1 | 0.1 | 0.1 | 0.05 |
| Sintering Temp. (° C.) |  | 2000 | 2000 | 1900 | 2000 |
| Density (g/cm³) |  | 3.26 | 3.26 | 3.27 | 3.26 |
| Contents of metal impurities (ppm) |  | less than 30 | less than 30 | less than 30 | less than 30 |
| Oxygen content (wt %) |  | 0.62 | 0.63 | 0.85 | 0.62 |
| Carbon content (wt %) |  | 0.04 | 0.04 | 0.04 | 0.04 |
| $CeO_2$ content (wt %) |  | 0.03 | 0.05 | 0.13 | 0.03 |
| $Y_2O_3$ content (wt %) |  | 0.06 | 0.04 | 0.09 | 0.03 |
| Crystalline phase (High power XRD) |  | AlN $CeAlO_3$ | AlN $CeAlO_3$ | AlN $CeAlO_3$ $CeAl11018$ $Y3Al5012$ | AlN $CeAlO_3$ $CeAl11018$ |

TABLE 6-continued

| | Example 16 | Example 17 | Example 18 | Example 19 |
|---|---|---|---|---|
| Volume resistivity at room temp. (Ω·cm) | 3E+10 | 8E+11 | 9E+11 | 6E+10 |
| Thermal conductivity (W/mK) | 90 | 93 | 95 | 90 |
| Bending Strength (MPa) | 300 | 340 | 360 | 360 |
| AlN grain diameter ($\mu$) | 7.7 | 7.5 | 6.1 | 7.7 |
| α | 1.5 | 1 | 1 | 1 |
| Color uniformity | Good | Good | Good | Good |

In Examples 1 to 6, the contents of $CeO_2$ in the sintered bodies are 0.05 to 0.74 wt %, which show a tendency that the content of $CeO_2$ slightly decreases than in the formulation of a raw material. The content of oxygen is 0.80 to 0.94 wt %, which is relatively large. Sintered bodies in which the content of $CeO_2$ is not more than 0.20 wt % is almost a single phase of aluminum nitride, but when the content of $CeO_2$ exceeds 0.20 wt %, a cerium aluminate phase comes to be precipitated. In each Example, the volume resistivity at room temperature is relatively low and a is small.

In Comparative Example 1, although the content of $CeO_2$ is less than 0.0001 wt %, the volume resistivity is high and a is large. In Comparative Examples 2 and 3, the contents of $CeO_2$ are more than 1 wt %, but the volume resistivity is high.

In Examples 7 to 15, the contents of $CeO_2$ in the sintered bodies are 0.01 to 0.98 wt %. The content of oxygen is 0.58 to 0.82 wt %, which is relatively large. In each Example, the volume resistivity at room temperature is relatively low and a is small.

In Comparative Example 4, the content of $CeO_2$ in the sintered body is less than 0.0001 wt %, the volume resistivity is high, and a is large. In Comparative Example 5, the content of $CeO_2$ in the sintered body is high, and the volume resistivity is high. In Comparative Example 6, no cerium oxide was added to a raw powder, and instead 0.3 wt. parts of yttrium oxide was added to reduce the volume resistivity of the sintered body. The sintered body contains 0.28 wt % of yttrium oxide, but the content of cerium oxide was less than 0.0001 wt %. As a result, the volume resistivity at room temperature conspicuously decreased, but a was 2.

Measurement with the high power XRD detected a $CeAl_{11}O_{18}$ phase in addition to the AlN phase in Examples 1, 2, 7 and 8, a $CeAlO_3$ phase in addition to the AlN phase in Examples 11–15, and the $CeAl_{11}O_{18}$ phase and the $CeAlO_3$ phase in addition to the AlN phase in Examples 3, 4, 5, 6, 9 and 10.

Further, yttrium oxide was added with cerium oxide in Examples 16–19, but no conspicuous change was observed with respect to characteristics such as the crystalline phase, volume resistivity, thermal conductivity, bending strength and α. In Examples 16–19, color uniformity was kept.

As mentioned above, according to the present invention, in the aluminum nitride sintered body having a high purity, the volume resistivity can be lowered, and the non-ohmic behavior can be suppressed between the voltage applied and the leak current.

What is claimed is:

1. An aluminum nitride sintered body, comprising:
   aluminum nitride having a polycrystalline structure of aluminum nitride crystals, said aluminum nitride crystals having an average particle diameter in a range of 5 $\mu$m to 20 $\mu$m; and
   cerium in a range of 0.01 wt % to 1.0 wt %, when calculated as an oxide thereof;
   wherein said aluminum nitride sintered body has a room temperature volume resistivity in a range of $1\times10^8$ Ω·cm to $1\times10^{12}$ Ω·cm under the application of 500 V/mm, and a value of a in an I-V relational equation, $I=kV^\alpha$, is in a range of 1.0 to 1.5, V being a voltage in a range of 100 V/mm to 1000 V/mm, I being a leak current when V is applied to said aluminum nitride body, k being a constant, and a being a non-linear coefficient.

2. The aluminum nitride sintered body set forth in claim 1, wherein the content of a metal element or elements, excluding aluminum and cerium, is not more than 100 ppm.

3. The aluminum nitride sintered body set forth in claim 1, wherein the content of a rare earth element or elements excluding cerium, when calculated as oxide or oxides thereof, is in a range of 0.01 wt % to 0.5 wt %.

4. The aluminum nitride sintered body set forth in claim 3, wherein the content of a metal element or elements, excluding aluminum and the rare earth element or elements, is not more than 100 ppm.

5. The aluminum nitride sintered body set forth in claim 3, wherein the rare earth element is yttrium.

6. The aluminum nitride sintered body set forth in claim 4, wherein the rare earth element is yttrium.

7. The aluminum nitride sintered body set forth in claim 1, wherein the content of carbon is not more than 0.05 wt %.

8. The aluminum nitride sintered body set forth in claim 1, comprising a single phase of aluminum nitride when observed by an X-ray diffraction method.

9. The aluminum nitride sintered body set forth in claim 1, comprising a phase of aluminum nitride and at least one of a phase of cerium aluminate and a phase of $CeAl^{11}O^{18}$ when observed by an X-ray diffraction method.

10. A semiconductor-producing member at least partially comprising the aluminum nitride sintered body set forth in claim 1.

11. The semiconductor-producing member set forth in claim 10, further comprising a substrate made of said aluminum nitride sintered body and having a metallic part buried in said substrate.

12. The semiconductor-producing member set forth in claim 11, wherein said metallic part comprises an electrostatic chuck electrode.

\* \* \* \* \*

UNITED STATES PATENT AND TRADEMARK OFFICE
CERTIFICATE OF CORRECTION

PATENT NO. : 6,486,085 B1
DATED : November 26, 2002
INVENTOR(S) : Yuji Katsuda and Masaaki Masuda It is certified that error appears in the above-identified patent and that said Letters Patent is hereby corrected as shown below:

<u>Title page,</u>
Item [57], ABSTRACT,
Line 8, please change "a" (second occurrence) to -- α --.

<u>Column 3,</u>
Line 41, please change "at" to -- α --.

<u>Column 12,</u>
Line 23, please change "a" (second occurrence) to -- α --.

Signed and Sealed this

Fourth Day of March, 2003

JAMES E. ROGAN
*Director of the United States Patent and Trademark Office*